United States Patent [19]
Thiele

[11] 3,943,419
[45] Mar. 9, 1976

[54] PROTECTIVE DEVICE FOR AT LEAST ONE THYRISTOR

[75] Inventor: Gerd Thiele, Erlangen, Frauenaurach, Germany

[73] Assignee: Siemens Aktiengesellschaft, Munich, Germany

[22] Filed: Sept. 26, 1974

[21] Appl. No.: 509,703

[30] Foreign Application Priority Data
Oct. 5, 1973  Germany............................ 2350233

[52] U.S. Cl.......... 317/33 SC; 317/11 A; 317/27 R; 321/11; 321/13
[51] Int. Cl.².................... H02H 3/28; H02H 7/10
[58] Field of Search...... 317/31, 33 R, 33 SC, 11 R, 317/11 A, 27 R; 321/11 R, 13, 27 R; 307/252 L, 136, 202, 133

[56] References Cited
UNITED STATES PATENTS

| | | | |
|---|---|---|---|
| 2,585,796 | 2/1952 | Lamm | 321/13 |
| 3,424,948 | 1/1969 | Ravas | 317/33 R |
| 3,487,261 | 12/1969 | Boksjo et al. | 317/33 R X |
| 3,558,977 | 1/1971 | Beaudoin | 317/33 SC |
| 3,626,271 | 12/1971 | Dewey | 307/252 L X |
| 3,662,250 | 5/1972 | Piccone et al. | 321/11 R |
| 3,808,455 | 4/1974 | Leisi | 317/11 A |
| 3,842,337 | 10/1974 | Ekstrom et al. | 307/252 L X |

FOREIGN PATENTS OR APPLICATIONS 2,005,724  11/1970  Germany.............................. 321/11

Primary Examiner—R. N. Envall, Jr.
Assistant Examiner—Patrick R. Salce
Attorney, Agent, or Firm—Kenyon & Kenyon Reilly Carr & Chapin

[57] ABSTRACT

This invention concerns a protective device for at least one thyristor. Separate measuring sensors are provided for determining the thyristor parameters of current and the magnitude and rising slope of the thyristor voltage. The measuring sensors are followed by a comparison stage which compares the parameters with definite, predetermined conditions, and transmits a trigger pulse for the thyristor. With the protective device according to the invention, the thyristor can be fired by means of its control electrode during the recovery time of the thyristor, if an overvoltage occurs.

12 Claims, 1 Drawing Figure

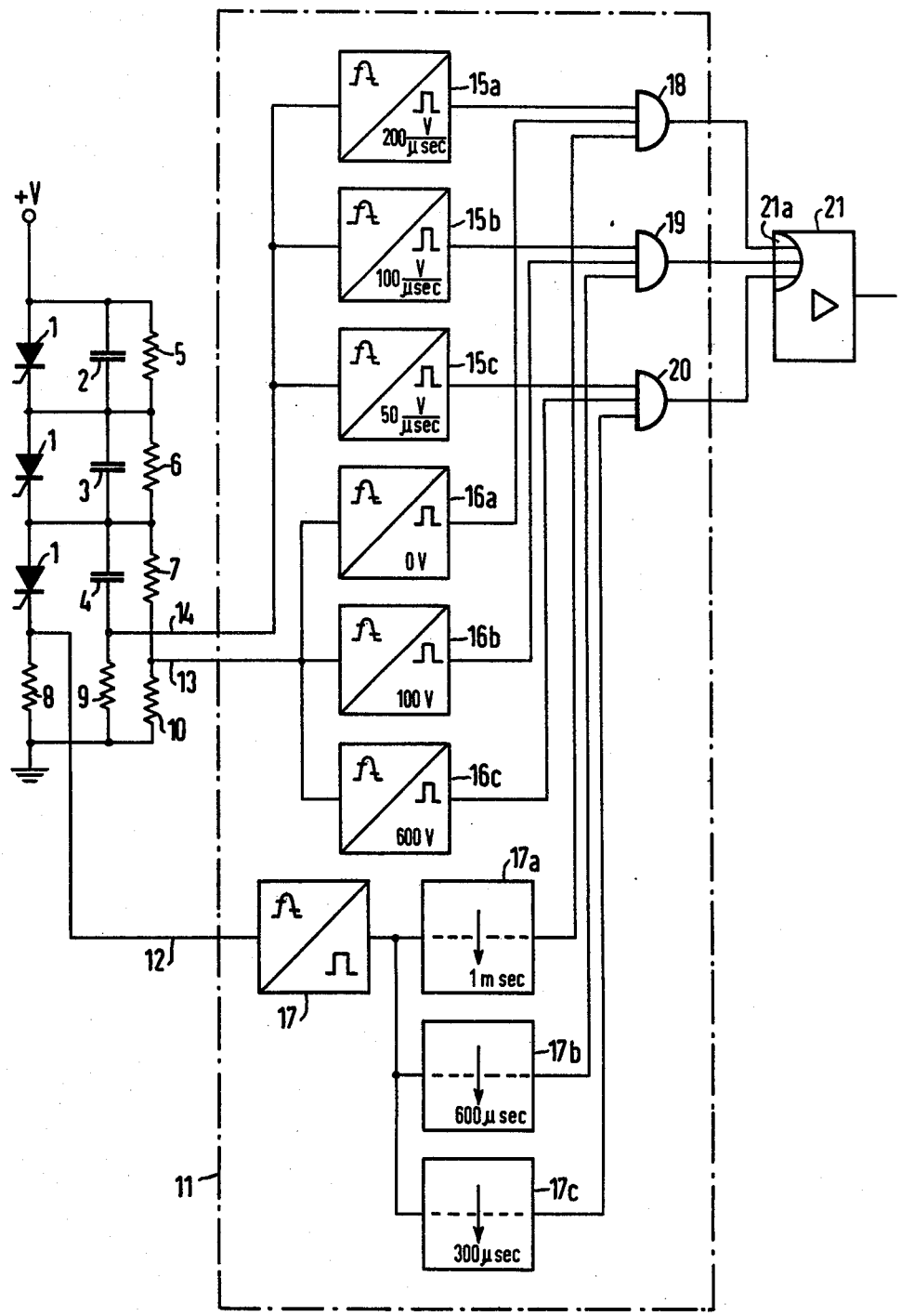

PROTECTIVE DEVICE FOR AT LEAST ONE THYRISTOR

BACKGROUND OF THE INVENTION

1. Field of the Invention

The invention concerns a protective device for at least one thyristor.

2. Description of the Prior Art

Thyristors can be destroyed by overvoltages which exceed the permissible peak voltage of the thyristor or by an excessive rate of rise of the voltage. External overvoltage circuits, for instance, with overvoltage arresters and RLC members are in the prior art for the purpose of protecting thyristors, such as are described, for instance, in the book "Thyristor Handbook," page 193 to 195.

These external overvoltage circuits are particularly important for thyristor switches for high-voltage applications, i.e., in HGU installations. These thyristor switches are formed by connecting in series an appropriate number of thyristors, which are controlled by means of magnetic pulse transformers.

These thyristor switches can be subjected to an overvoltage stress at any time by external causes such as flashovers at insulators or by lightning strokes hitting the transmission lines. Extensive protection of the switches against high voltages is achieved with an external overvoltage circuit mentioned above, in which the switches are shunted by overvoltage arresters which limit the magnitude of the overvoltage to permissible values for the thyristors and in which the rate of rise of the voltage for the thyristors within a switch is limited by the use of RCL members which are arranged distributed in the switch.

Only if overvoltages occur during a certain time interval, i.e., during the recovery of the thyristors which follows the current conduction time, can renewed firing of each thyristor occur if a positive voltage should appear at its anode-cathode path at a specific voltage value. This voltage value which can renew firing depends on the electric stress and the individual thyristor unit. It should further be mentioned here that the recovery time of a thyristor increases with the rate of rise and with the magnitude of the anode voltage from negative toward positive values. Renewed switching on of thyristors by means their anode-cathode voltage without a control pulse, so-called "high-level firing," may lead to the destruction of thyristors, which cannot be avoided completely with known external overvoltage circuits.

It is an object of this invention to provide a protective device such that high-level firing of the thyristor is impossible is overvoltages occur during the recovery time of the thyristor.

SUMMARY OF THE INVENTION

According to the invention, there is provided one measuring sensor each for determining the thyristor current and the rising slope of the thyristor voltage connected to a comparison stage which delivers a trigger pulse for the thyristor when definite, predetermined conditions are reached. Preferably, a further measuring sensor for determining the magnitude of the thyristor voltage is arranged, whose output is also fed to the comparison stage.

With the protective device according to the invention, a triggering of the thyristor by means of the control electrode is achieved if an overvoltage occurs during the recovery time. The thyristor is switched on for protection within a certain time after its current conduction time in a programmed manner by a control pulse from the pulse amplifier as a function of the rate of rise of the recurring voltage. The time, after which this firing takes place, depends on predetermined values of the ratio of the measured quantities, whereby the dependence of the recovery time, i.e., its increase with increasing rate of rise and increasing amplitude of the recurring anode voltage can be taken into consideration.

The comparison stage responsive to the voltage and voltage rate measuring sensors contains at least one limit indicator for each sensor and the outputs of these limit indicators are applied to a logic element. Only one limit indicator is associated with a thyristor current measuring sensor. This limit indicator addresses multiple monostable flip-flops which have different output pulse on times. The outputs of these monostable flip-flops are connected with one of the logic elements. With this design of the comparison stage, the values for different conditions of the measured quantities of thyristor current, magnitude of the thyristor voltage and rate of voltage rise can be combined to provide a thyristor and control pulse under different conditions.

BRIEF DESCRIPTION OF THE DRAWINGS

FIG. 1 shows a thyristor with measuring sensors for thyristor parameters of voltage, current, and rate of increase of voltage along with a comparison stage for comparing these parameters with predetermined values and means responsive to this comparison stage for generating a control firing pulse for the thyristor.

DESCRIPTION OF THE INVENTION

FIG. 1 shows several thyristors 1, which, for instance, form a thyristor switch, and are connected in series between a positive voltage +V and ground. Thyristor units with several thyristors connected, in parallel can also be used as the thyristors 1. To the control electrode of each thyristor a trigger pulse can be applied for the purpose of triggering, which is generated by a trigger pulse generator not shown in the drawing.

Each thyristor 1 is shunted by a capacitor 2, 3 or 4 and a resistor 5, 6 or 7. The capacitors 2 to 4 are equalizing capacitors to avoid unequal voltage distribution because of the iterative conductor effect. At the cold end of the series circuit, i.e., at reference or zero potential, there is connected in series with the last thyristor 1 a current transformer for the thyristor current, which in the example of the embodiment is a resistor 8. As a measuring sensor for the rate of rise or rising slope of the thyristor voltage, the capacitor 4 is supplemented in the embodiment example by a resistor 9 to form an R-C member. The voltage at the resistor 9 is proportional to the current through the equalizing capacitor 4 and therefore, proportional to the rising slope of the voltage at the thyristor 1. As the measuring sensor for the thyristor voltage, a resistor 10 is connected in series with the resistor 7.

The measured voltages of the three measuring sensors 8, 10, and 4 and 9 which represent the magnitude of the thyristor current, the thyristor voltage and the rate of rise of the thyristor voltage, are applied to a comparison stage 11 by means of lines 12, 13 and 14. Limit indicators 15, 16 and 17 are arranged in the comparison stage 11. The line 14, at which the value of the voltage appears which represents the slope of the thyristor voltage, is applied to three limit indicators 15a 15b and 15c which generate output pulses only when input voltages achieve limit values of a sufficient value. The thyristor voltage is likewise applied by means of line 13 to three limit indicators 16a to 16c, which likewise have different response values. The value of the voltage which represents the thyristor current appears at the line 12 which is applied to a limit indicator 17 which drives three monostable flip-flops 17a to 17c, which have different pulse output times.

The output of the related limit indicators or flip-flops which belong to the respective measuring sensors, i.e., for instance, the output of the limit indicators 15a and 16a and of the monostable flip-flop 17a, are applied to a respective logic element 18, 19 or 20. In the example of the embodiment the logic elements 18, 19 or 20 are AND gates. The outputs of the AND gates 18 to 20 are applied to the OR input 21a of a pulse generator stage 21. The pulse generator, not shown, generates pulses which can fire the thyristors 1.

To explain the operation of the circuit, assume that thyristors 1 are used, in which the limit (variation from unit to unit) of the recovery time is 300 μsec for a change of the voltage from 600 V to +600 V with a maximum rate of rise of 50 V/μsec. Through the choice of the response values for the limit indicators 15 and 16 and the switching times of the monostable flip-flops 17, which are shown in FIG. 1, conditions for the quantities measured by the measuring sensors 7, 8, 4 and 9 are predetermined, for which a trigger pulse is formed and by which protection of the thyristors 1 is insured in the event of an overvoltage during the recovery time. The limit indicator 17 then passes on a signal to one of the three succeeding monostable flip-flops 17a, 17b, 17c if the current in the thyristor 1 falls below a given limit. The interrelation of the individual limit indicators and flip-flops with respect to each other and to the succeeding logic element is arranged so that the monostable flip-flop 17a with the longest switching time is connected, together with the limit indicator 15a for the steepest slope of the thyristor voltage and the limit indicator 16a for the lowest thyristor voltage, is connected to an AND gate 18, and vice versa, the monostable flip-flop 17c with the shortest time, together with the limit indicator 15c with the smallest slope and with the limit indicator 16c with the highest voltage is connected to another AND gate. With this association of the limit indicators and the flip-flops it is insured that for any dangerous case of overvoltage during the recovery time of the thyristors, uncontrolled firing of the thyristors 1 is converted into an intentional triggering by means of the control input and thereby, a programmed emergency firing of the thyristors, dependent on the rate of change of the voltage dv/dt, is obtained during the recovery time.

It should be noted that by increasing the number of limit indicators and the monostable flip-flops a further refinement of the response values can, of course be obtained, wherein the protective device performs the programmed firing of the thyristors during the recovery time. Thus, a protective device is obtained which is inexpensive to build and which insures, in combination with known external overvoltage circuits, complete overvoltage protection of thyristors.

What is claimed is:

1. Apparatus for protecting a thyristor during its recovery time comprising:

means for generating a signal proportional to the thyristor current,
    means for generating a slope signal proportional to the arising slope of the thyristor voltage,
    means for generating a signal proportional to the magnitude of the thyristor voltage,
    means for generating comparison signals if said current signal, slope signal, and voltage signal are each different from predetermined values, and
    means responsive to said comparison signals for generating a firing pulse for the thyristor.

2. The apparatus of claim 1 wherein said means for generating a signal proportional to the thyristor current is a current transformer in series with said thyristor.

3. The apparatus of claim 2 wherein said means for generating a slope signal proportional to the rising slope of the thyristor voltage is a series connected resistor and capacitor in parallel with said thyristor, wherein said slope signal is generated at the connection of said resistor and capacitor.

4. The apparatus of claim 3 wherein said means for generating comparison signals comprises:

at least one first limit indicator to generate a first pulse if said slope signal is greater than a predetermined voltage slope value,
    a second limit indicator to apply a signal, if said current signal falls below a predetermined current value, to at least one monostable multivibrator which generates a predetermined pulse time length, and
    an AND circuit responsive to the ouput to said first limit indicator and the output of said monostable multivibrator.

5. The apparatus of claim 1 wherein said means for generating a slope signal proportional to the rising slope of the thyristor voltage is a series connected resistor and capacitor in parallel with said thyristor, wherein said slope signal is generated at the connection of said resistor and capacitor.

6. The apparatus of claim 1 wherein said means for generating a signal proportional to the magnitude of the thyristor voltage is a resistor in parallel with said thyristor.

7. The apparatus of claim 1 wherein said means responsive to said comparison signals for generating a firing pulse for the thyristor is a pulse generator.

8. The apparatus of claim 1 wherein said means for generating comparison signals comprises:

at least one first limit indicator to generate a first pulse if said slope signal is greater than a predetermined voltage slope value,
    a second limit indicator to apply a signal, if said current signal falls below a predetermined current value, to at least one monostable multivibrator which generates a predetermined pulse time length,
    at least one third limit indicator to generate an output pulse if said voltage signal is greater than a predetermined voltage value,
    an AND circuit responsive to the output of said first limit indicator, the output of said third limit indicator, and the output of said monostable multivibrator.

9. The apparatus of claim 8 wherein said means for generating a signal proportional to the thyristor current is a current transformer in series with said thyristor.

10. The apparatus of claim 8 wherein said means responsive to said comparison signals for generating a firing pulse for the thyristor is a pulse generator.

11. The apparatus of claim 8 in which the signal from said second limit indicator is applied to three separate monostable multivibrators each generating a predetermined pulse time length which is different.

12. The apparatus according to claim 11 wherein:
  a. three first limit indicators each having separate predetermined slope voltage values are provided;
  b. three third limit indicators each having different predetermined voltage values are provided;
  c. three seaprate AND circuits are provided, the first AND circuit having as inputs the output of the first limit indicator having the highest predetermined voltage slope value, the output of the third limit indicator having the smallest predetermined voltage value and the output of the monostable multivibrator generating the longest pulse length, the second AND gate having as inputs the outputs of the first limit indicator having predetermined slope voltage between those of the other two first limit indicators, the output of the third limit indicator having a predetermined voltage value between those of the other two thrid limit indicators and the output of the monostable multivibrator having a pulse time length between those of the other two monostable multivibrators, the third AND gate having as inputs the output of the first limit indicator having the smallest predetermined voltage slope value, the third limit indicator having the highest perdetermined voltage value and the monostable multivibrator having the shortest predetermined pulse time length; and further including;
  d. an OR gate having as intputs the outputs of said first, second and third AND gates.

* * * * *

UNITED STATES PATENT AND TRADEMARK OFFICE
CERTIFICATE OF CORRECTION

PATENT NO. : 3 943 419
DATED : March 9, 1976
INVENTOR(S) : Gerd Thiele

It is certified that error appears in the above-identified patent and that said Letters Patent are hereby corrected as shown below:

Column 1, line 54, change "is" to --if--.

Column 3, line 25, change "600V" to: -600V

Signed and Sealed this

Twentieth Day of July 1976

[SEAL]

Attest:

RUTH C. MASON
*Attesting Officer*

C. MARSHALL DANN
*Commissioner of Patents and Trademarks*